US007212273B2

(12) United States Patent
Terashima

(10) Patent No.: US 7,212,273 B2
(45) Date of Patent: May 1, 2007

(54) EXPOSURE APPARATUS AND METHOD OF PRODUCING DEVICE

(75) Inventor: Shigeru Terashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 166 days.

(21) Appl. No.: 10/785,252

(22) Filed: Feb. 23, 2004

(65) Prior Publication Data

US 2004/0174505 A1    Sep. 9, 2004

(30) Foreign Application Priority Data

Mar. 4, 2003    (JP)    ............... 2003-057104

(51) Int. Cl.
G03B 27/52    (2006.01)
G03B 27/42    (2006.01)
G03B 27/58    (2006.01)

(52) U.S. Cl. .................... 355/30; 355/53; 355/67; 355/72; 355/75; 250/492.1; 430/5; 430/30; 430/311

(58) Field of Classification Search ............. 355/30, 355/53, 67, 72, 75
See application file for complete search history.

(56) References Cited

U.S. PATENT DOCUMENTS

| 5,338,939 | A  | * | 8/1994 | Nishino et al. ........... 250/492.2 |
| 6,222,614 | B1 | * | 4/2001 | Ohtomo ........................ 355/53 |
| 6,226,073 | B1 | * | 5/2001 | Emoto .......................... 355/53 |
| 2002/0000029 | A1 |  | 1/2002 | Emoto |
| 2005/0134814 | A1 | * | 6/2005 | Bakker ........................ 355/30 |
| 2006/0001322 | A1 | * | 1/2006 | Binnard ....................... 310/12 |

FOREIGN PATENT DOCUMENTS

JP    2001-297967    10/2001
WO    WO9634051    * 10/1996

* cited by examiner

*Primary Examiner*—D. Rutledge
(74) *Attorney, Agent, or Firm*—Canon U.S.A. Inc IP Division

(57) ABSTRACT

To solve the problem, when the inside of an exposure apparatus is placed under vacuum, of a gas being emitted from a resin tube provided in the exposure apparatus, and a component of the gas adhering to and being deposited on the surface of an optical element, so that the optical performances of the optical element and the exposure apparatus are deteriorated, the exposure apparatus is provided with means for controlling the surface temperature of the resin tube in the exposure apparatus up to a predetermined temperature.

38 Claims, 6 Drawing Sheets

EXPOSURE APPARATUS AND METHOD OF PRODUCING DEVICE

BACKGROUND OF THE INVENTION

1. Field of the Invention

The present invention relates to an exposure apparatus with which, in general, a fine circuit pattern is transferred and, more particularly, to an exposure apparatus having piping made of a high polymer material (i.e., piping made of resin) and arranged inside the exposure apparatus.

2. Description of the Related Art

Hitherto, as a printing method (e.g., photolithography) for forming fine semiconductor elements such as semiconductor memories, logic circuits or the like, reduction projection exposure has been employed. The minimum size of an object which can be transferred by the reduction projection exposure is proportional to the wavelength of light used for the transfer, and is inversely proportional to the numerical aperture of the projection optical system. Therefore, light beams having shorter wavelengths have been applied to transfer finer circuit patterns. In particular, ultra-violet (UV) rays having shorter wavelengths have been employed. That is, mercury lamp i rays (365 nm in wavelength), KrF excimer laser beams (248 nm), and ArF excimer laser beams (193 nm) have been used. At present, an exposure apparatus using UV rays having a still shorter wavelength, i.e., F2 laser beams (157 mm) is under development. In the wavelength range of the F2 laser, the absorption of the beams into oxygen is not negligible. Thus, an exposure apparatus using the F2 laser has a structure in which an inert gas such as nitrogen, helium, or the like can be filled in the spaces through which the light beams travel.

For efficient printing of very fine circuit patterns with a size of less than 0.1 µm, a reduction projection exposure apparatus using extreme UV (EUV) rays having a still shorter wavelength than UV rays, i.e., having a wavelength of about 10 to 15 nm, has been developed. Moreover, an exposure apparatus using an electron beam (EB) has been developed. Referring to exposure apparatuses using electron beams, different types of exposure apparatuses, e.g., a direct-writing system, a multiple-electron-source system, a stencil mask system, and the like, have been developed. For the above-described exposure apparatuses using EUV rays and EB, it is necessary to set the light-path space in a high vacuum state or in a reduced pressure environment.

However, when light beams having short wavelength are used for exposure, the light energy is increased, so that the light beams decompose slight amounts of carbon compounds which have been gasified and are present in the light paths. In some cases, due to the light energy, substances produced by the decomposition are deposited on and adhere to optical elements such as lenses, mirrors, stops and the like which constitute the exposure apparatus. Thus, in the case in which the optical elements are lenses, the transmittance is reduced. In the case in which the optical elements are mirrors, the reflectivity becomes low. In the case in which the optical elements are stops, the sizes and shapes are changed. Hence, the performances of the optical elements are deteriorated when substances produced by the decomposition adhere to the optical elements. When the respective optical elements are deteriorated, the radiation intensity (i.e., optical strength) or imaging-performance of the exposure apparatus is changed. Thus, the optical performance required of the exposure apparatus is deteriorated. In order to overcome the problem of deteriorated optical performance, a significant amount of labor and time is required to disassemble and clean the optical system. Therefore, countermeasures against the above described problems have been investigated. For example, it has been considered to fill the optical path space (i.e., exposure space) with a high-purity inert gas that does not decompose with light, or to keep the optical path space in a high vacuum state.

Present-day exposure apparatuses are provided with parts made of resins containing carbon compounds which may be deposited on and adhere to optical elements, deteriorating the performance of the exposure apparatuses. It is not practical to form exposure apparatuses which exclude resin parts. For example, when a wafer and a reticle are scanned and exposed, stages for moving the wafer and reticle are driven in the X-, Y-, and Z-axial directions and, moreover, the stages are driven rotationally. If the temperature of the wafer or reticle placed on the stage cannot be kept constant and uniform, deterioration of the transfer accuracy will occur. When the stage is driven, heat is generated in the driving members. Thus, waste-heat from the driving members must be taken into account. Ordinarily, in such cases, constant temperature water is circulated to eliminate the heat. To circulate constant temperature water through a stage which is repeatedly moved, a flexible resin-tube must be used.

It has been proposed to use a flexible metallic tube. However, with repeated movement, the metal may become fatigued. Thus, it would become necessary to frequently replace the metallic tubes. On the other hand, resin tubes are sufficiently durable for the repeated movement, and thus, are superior in safety and economy. However, the resin tubes are made of high polymer compounds, so that components of the high polymer compounds may be decomposed and gasified, although the amounts are slight, resulting in the above described problems.

At present, the development of a material for the tubes, such as fluorine-containing resins, from which a smaller amount of organic substance is released compared to known polyurethane tubes or the like has been investigated. However, in contrast to the emission of gas from an inorganic material, the emission of gas from an organic component is not negligible.

Japanese Patent Laid-Open No. 2001-297967 (corresponding U.S. Patent Publication Number 2002000029) discloses an exposure apparatus with which the amount of a gas component emitted from a resin tube can be reduced, even if the resin tube is arranged in a vacuum environment, as described with respect to the above-described exposure apparatuses using EUV rays and electron beams. Japanese Patent Laid-Open No. 2001-297967 discloses an exposure apparatus provided with a double piping composed of an inside piping made of resin and an outside piping also made of resin, that covers the outside periphery of the inside piping. A gas-exhausting mechanism for exhausting gas present in the space defined by the inside and outside pipings is also provided.

However, the invention disclosed in Japanese Patent Laid-Open No. 2001-297967 does not address the cases where it is necessary to further enhance the purity of an inert gas filled in the exposure space and the optical path space, to further enhance the vacuum (i.e., to decrease the atmospheric pressure), and to further reduce the concentration of gas which becomes a material deposited on and adhering to the optical elements (i.e., causing the contamination).

SUMMARY OF THE INVENTION

It is an exemplary object of the present invention to solve the above-described problems and to provide an exposure apparatus having a resin part inside thereof, the exposure apparatus being provided with a temperature controlling means for maintaining the surface of the resin part at a predetermined temperature or lower.

Other features and advantages of the present invention will become apparent from the following description taken in conjunction with the accompanying drawings, in which like reference characters designate the same or similar parts throughout the figures thereof.

DESCRIPTION OF THE PREFERRED EMBODIMENTS

Preferred embodiments of the present invention will now be described in detail in accordance with the accompanying drawings.

First Embodiment

Figure 1:
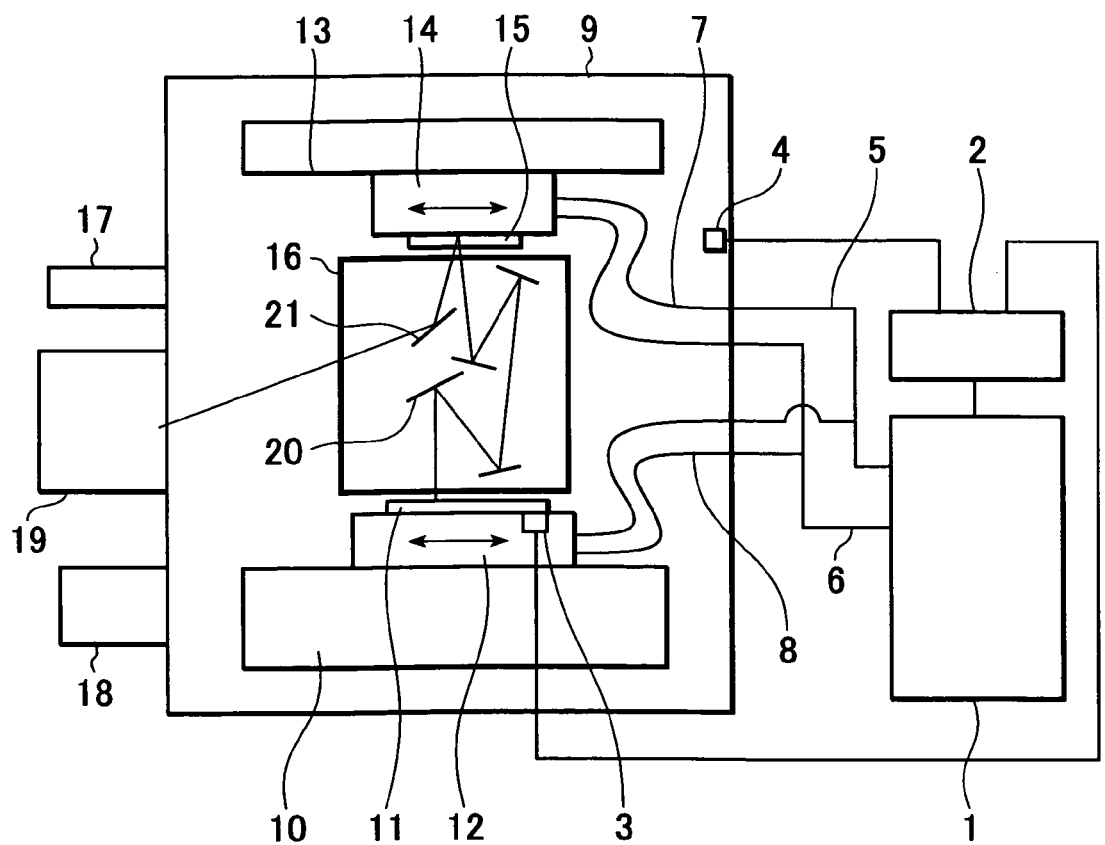
FIG. 1 illustrates the configuration of a EUV exposure apparatus according to a first embodiment of the present invention.

FIG. 1 shows an exposure apparatus using EUV rays as exposure light according to a first embodiment of the present invention. In FIG. 1, a constant temperature water circulating apparatus 1, a temperature controller 2, a wafer-temperature sensor 3, a temperature sensor 4 for the inner wall of the exposure apparatus, feed-piping 5 external to the exposure apparatus for supplying constant-temperature water from the constant-temperature water circulating apparatus 1, a return-piping 6 similar to the feed-piping 5, feed-piping 7 internal to the exposure apparatus, return-piping 8 internal to the exposure apparatus, a chamber 9 enclosing at least a part of the exposure apparatus so that the inside of the exposure apparatus can be kept in the vacuum state, a wafer stage platen 10, a wafer 11, a wafer stage 12, a reticle stage support 13, a reticle stage 14, a reflection type reticle 15, a projection optical system 16 (the system contains a mirror for guiding a light beam reflected from the reflection type reticle 15 to the water 11 and excludes a mirror 21 for guiding a light beam to the reflection type reticle), a residual gas analyzer 17, a chamber-exhausting system 18, an EUV illuminating optical system 19, a mirror 20 which is a part of the above-described projection optical system 16 and has a thin film formed so as to reflect the EUV light-beam, and a mirror 21 which is a part of the above-described illuminating optical system 19 are shown.

The reflection type reticle 15 is irradiated with a EUV beam guided from an optical source (not shown) to the exposure apparatus chamber 9 via the illuminating optical system 19. The reflected beam is reduced by means of a projection optical system 16 in a body tube (not shown) and is projected onto the wafer 11. In this case, the beam is formed into a slit-shape by means of the illuminating optical system 16, and then, the reticle 15 is irradiated with the beam. The reticle 15 and the wafer 11 are scanned at scanning velocities corresponding to the reduction-magnification ratios thereof. Thus, exposure is carried out. The exposure apparatus has a mechanism in which the reticle 15 (or a mask) is held by means of a reticle chuck (not shown) to be mounted on the reticle stage 12, the wafer 11 is held by means of a wafer chuck (not shown) to be mounted on the wafer stage 12, and the reticle stage 14 and the wafer stage 12 are scanned synchronously at a velocity ratio proportional to the reduction-magnification.

Referring to the scanning direction, X represents a scanning direction on the reticle-surface or the wafer-surface, Z represents the direction perpendicular to the reticle-surface or wafer-surface, and Y represents the direction perpendicular to both of the X-axis and the Z-axis.

The reticle stage 14 has a mechanism (not shown) by which the stage 14 can be moved at a high speed. It is necessary for the movement distance to be in such a range as exceeds the width of an original pattern formed on the reticle 15, specifically, in the range of about 100 mm to 300 mm. Moreover, the reticle stage 14 has a fine-movement mechanism (not shown) for movement in the X-, Y-, and Z-directions and in the rotational directions around the respective axes. Thus, the reticle 15 can be positioned. The position and the orientation of the reticle stage 14 are measured with a laser interferometer, and are controlled based on the measurement results.

Similarly to the reticle stage 14, the wafer stage 12 has a mechanism (not shown) by which the stage 12 can be moved in the X-direction at a high speed. Moreover, the reticle stage 14 has a fine-movement mechanism (not shown) for movement in the X-, Y-, and Z-directions and in the rotational directions on the respective axes. Thus, the wafer can be positioned. The position and the orientation of the wafer stage 12 are measured with a laser interferometer, and are controlled based on the measurement results.

The positional relationship between the position of the reticle 15 and the optical axis of the projection optical system 16, and the positional relationship between the position of the wafer 11 and the optical axis of the projection optical system 16, are measured by means of an alignment detecting mechanism (not shown). The positions and the angles of the reticle stage 14 and the wafer stage 12 are set so that the projection image of the reticle 15 is formed at a predetermined position on the wafer 11.

The focus-position in the Z-direction on the wafer surface is measured by means of a focus-position detecting mechanism (not shown). The wafer surface is always kept at the image-forming position of the projection optical system 16 during the exposure by controlling the position and the angle of the wafer stage 12.

After scan-exposure (scan-exposure for one shot area of exposure area) is carried out one time on the wafer 11, the wafer stage 12 is stepped in the X- and Y-directions to the next scan-exposure start position. The reticle stage 14 and the wafer stage 12 are then synchronously scanned in the X-direction at a velocity ratio proportional to the reduction-magnification of the projection optical system 16.

As described above, the reticle 15 and the wafer 11 are synchronously scanned while the reduction projection image of the reticle 15 is formed on the wafer. This process (i.e., step and scan) is repeated. Thus, the transfer pattern of the reticle 15 is transferred onto the whole surface of the wafer 11. Thus, it is necessary for the wafer stage 12 to move the whole surface of the wafer to the exposure positions. Accordingly, the exposure apparatus is required to have a configuration such that the wafer stage 12 can be moved in a wide range. Specifically, the exposure apparatus is required to have a configuration such that it can be moved by at least 300 mm in each of the X- and Y-directions.

In this embodiment, a resin tube, which is flexible and durable, is used as piping through which circulation water for cooling the stage 14 movable by at least 300 mm flows, or as piping connecting the movable stage to the substantially fixed or fixed chamber. To reduce the amount of gas emitted from the resin tube in the vacuum state as much as possible, methods of cooling the resin surface have been devised. According to one of the methods, constant-temperature water set at a lower temperature than the inside of the exposure apparatus is circulated in the resin tube.

For example, the temperature of the inner wall of the exposure apparatus is measured as shown in FIG. 1. The temperature of the inner wall is 23° C., which is substantially equal to the temperature of the clean room in which the exposure apparatus is set. The temperature of the wafer surface is controlled so that the exposure can be carried out at 25° C. Thus, the temperature of water circulated in the resin tube is set at 13° C., which is 10° C. lower than the temperature (23° C.) of the inner wall of the exposure apparatus, which in turn is lower than the temperature in the clean room. Preferably, the water temperature is set to be lower by at least 10° C. than the lower one of the temperature of the inner wall at the surface of the exposure apparatus and the temperature at the surface of the wafer. By setting the temperature as described in the above example, the surface temperature of the resin tube in the feed-path of the constant-temperature water circulating path was kept at approximately 13° C. The surface temperature of the resin tube in the return-path became about 14° C. or higher, but was kept at a sufficiently lower temperature than the temperature of the wall in the exposure apparatus, i.e., 23° C. In the above example, water was used as the liquid circulated in the resin tube. However, any liquid that would enable practice of the present invention is applicable.

Figure 2:
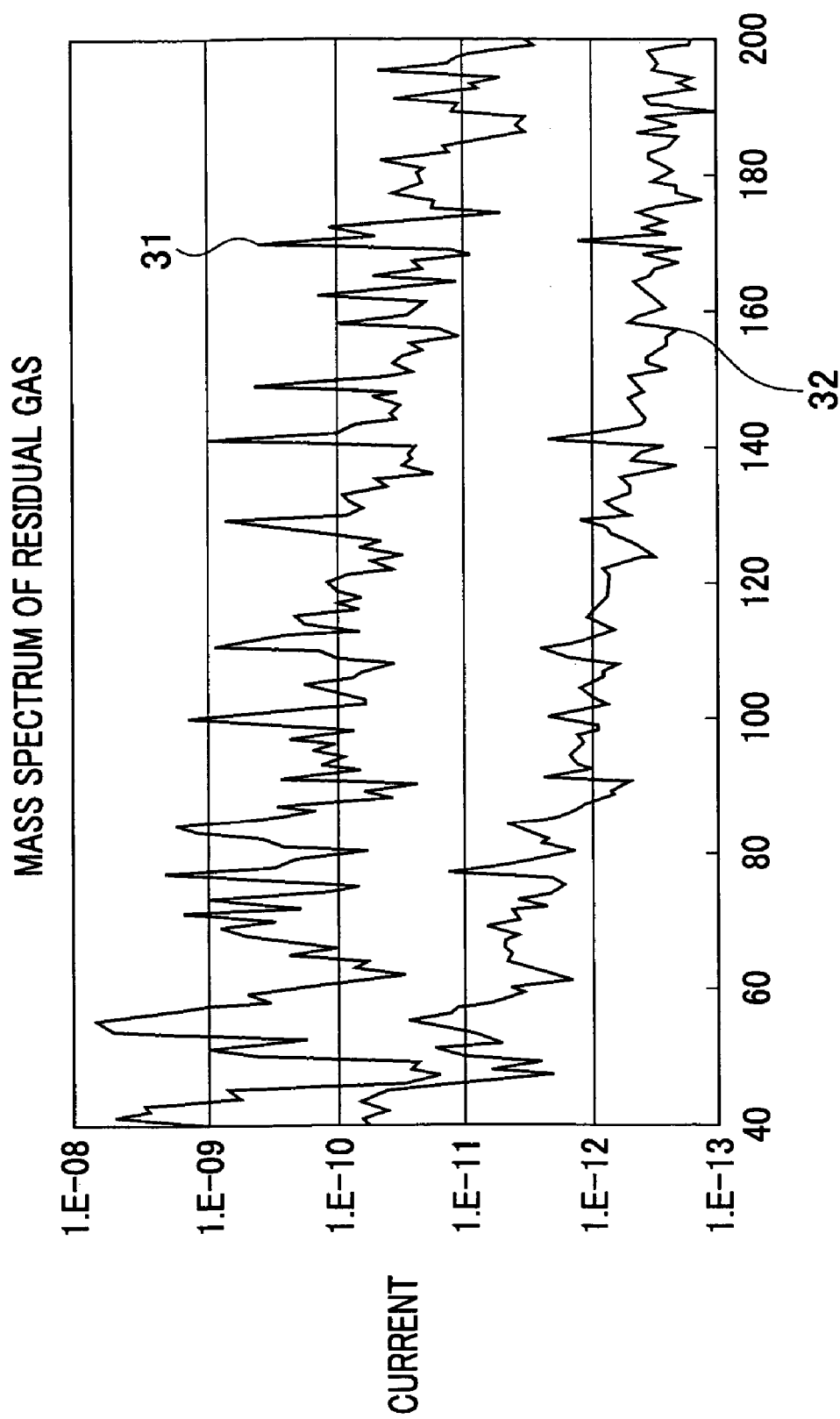
FIG. 2 is a mass spectrum showing the gas-emission preventing effect of the first embodiment.

FIG. 2 shows an example of a mass spectra obtained by measurement of a residual gas component in the vacuum chamber using a four-pole mass spectrometer. Specifically, reference numeral 32 represents the mass spectrum obtained when a urethane resin tube was disposed in the vacuum chamber 9 while water was circulated outside of the urethane resin to cool the tube. Reference numeral 31 represents the mass spectrum obtained when the urethane resin tube was disposed and not cooled. The mass is plotted as the abscissa, and the output current of the mass spectrometer as the ordinate. The output current is substantially proportional to the partial pressure of the residual gas component. To compare both of the residual gas components with respect to their organic components, FIG. 2 shows the measurement results of substances having a mass of 40 or higher. Per FIG. 2, the output currents obtained when constant temperature water at 13° C. was circulated in the urethane tube and when the water was not circulated, exhibit a difference of approximately one or two orders of magnitude. This means that the emitted gas from the urethane tube can be considerably suppressed by reducing the temperature of the urethane tube by about 10° C. as compared to the temperature of the exposure chamber.

As described above, the emission of gas from the resin tube can be suppressed by reducing the temperature of the resin tube. The lower the temperature of the resin tube, the more the emission of gas is suppressed. However, when the resin tube temperature becomes excessively low, some obstacles occur. First, to lower the temperature of the resin tube to 0° C. or below, it is necessary, for example, to use an anti-freezing fluid in place of water. Moreover, the lower the temperature of the resin tube, the more rigid the resin becomes. Thus, the flexibility of the resin deteriorates, which results in losing the advantage that using resin provides. Furthermore, additional problems include occurrence of condensation on the circulation-supplying piping positioned outside the chamber and the feed-through portion in the chamber wall. To eliminate the above-described obstacles, preferably, the temperature of the circulated water is set to be between 5° C. and 18° C. Moreover, to prevent a reduction in cooling efficiency, countermeasures such as winding a heat insulating material around the pipings provided outside the chamber 9 can be used. The temperature range provided above is the preferred range, however, any temperature setting that would enable practice of the present invention is applicable.

In the case in which air-bearings are used as guides for the stages 12 and 14, it is required to supply gas to the bearings through a flexible resin tube. In this case, the temperature of the gas to be supplied is also set to be low, e.g., 10° C. before being supplied. Thereby, the surface temperature of the resin tube can be kept lower than that of the inner wall of the exposure apparatus or that of the wafer at exposure and, hence, the adhesion of deposited substances on the optical elements in the exposure apparatus can be prevented.

Second Embodiment

Figure 3:
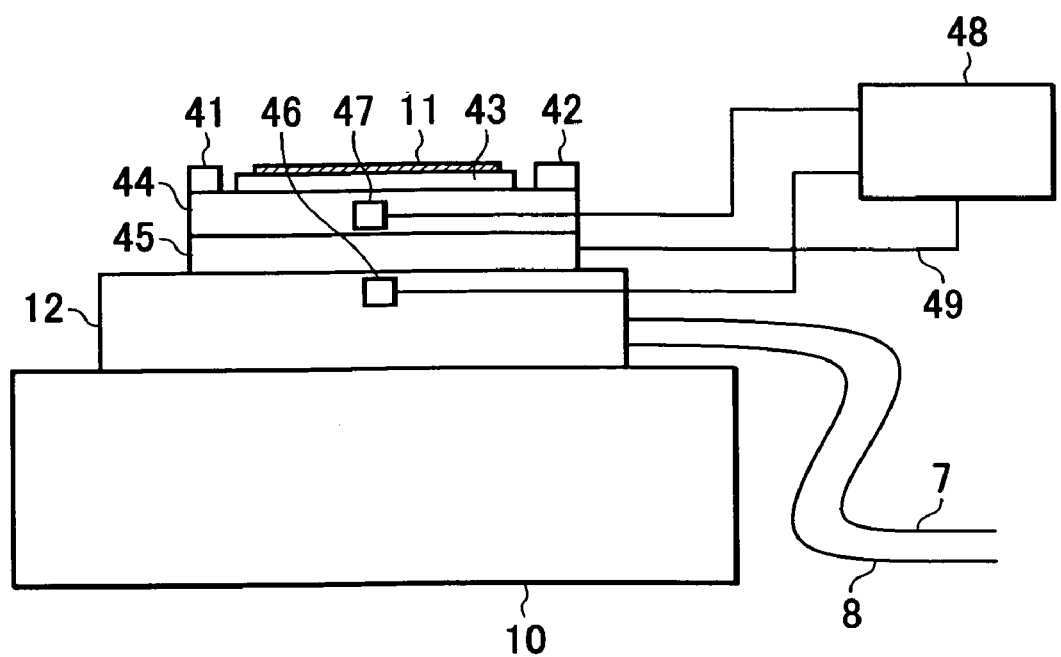
FIG. 3 illustrates a second embodiment of the present invention.

FIG. 3 shows a second embodiment of the present invention. Hereinafter, mainly, the wafer stage 12 and its surrounding elements will be described with reference to FIG. 3. The description of the elements identical to those depicted in FIG. 1 will not be repeated. In FIG. 3, a mirror 41 of an interference system, a wafer positional reference point 42, a wafer chuck 43 for supporting the wafer 11, a seat 44 on which the wafer chuck 43 and a wafer position-measuring device (not shown) are placed, a Peltier device 45, a temperature sensor 46 for the wafer stage 12, a temperature sensor 47 for the seat 44, a controller 48 which calculates a measured temperature difference to drive the Peltier device, and a cable 49 for driving the Peltier device are shown.

Similarly to the first embodiment, constant temperature water is circulated because of the waste heat in the wafer-stage driving part of the exposure apparatus. In this case, a resin tube is used, and the constant temperature is set at 10° C. The heat quantity eliminated by the circulation of water with a low constant-temperature is greater than the waste heat in the driving part. Thus, the wafer stage 12 is cooled so that the temperature reaches that of the constant-temperature water. The wafer chuck 43, a wafer positional reference point 42 for positioning the stage 12, a member for measuring the wafer position, such as a mirror 41 as an interferometer useful for position-measurement, or the like are disposed on the wafer stage 12. Cooling of the wafer stage 12 influences the portion of the wafer stage 12 in which the wafer chuck 43 and the wafer positional reference position 42 are disposed, so that the temperature of that portion becomes lower than a target value. As such, the distance between the wafer 11 and the position-measuring device (not shown) may be changed. Thus, the correct position can not be measured.

In this embodiment, the seat 44 on which the wafer chuck 43, the wafer positional reference point 42, the mirror 41 of the interferometer, and the like are placed is provided. The Peltier device 45 is inserted between the seat 44 and the wafer stage driving part (now shown) of the exposure apparatus. The difference between the temperatures of the wafer stage driving part and the seat 44 is measured. Voltage is applied to the Peltier device 45 so that the wafer 11 has a target temperature at exposure. The target temperature is set for each seat 44. The Peltier device 45 can provide a difference between the temperatures of the upper and lower surfaces thereof, which depends on the applied voltage thereto. In this embodiment, the target temperature of the wafer 11 at exposure is set at 25° C. The temperature of the wafer stage driving part is measured. If a change in the temperature is found, the voltage applied to the Peltier device 45 is controlled so as to compensate for the change, so that the seat 44 is kept at a temperature of 25° C.

In this embodiment, the Peltier device 45, which can control the temperature difference, is used. Similarly, a heater may be inserted between the seat 44 and the wafer stage driving part to control the temperature of the seat 44. In this case, the same operation as described above can be achieved.

As described above, it is a main object of the present invention to keep the surface of the resin at a lower temperature than the inside of the exposure apparatus. According to this embodiment, the influence of the above-described temperature-control over the exposure apparatus can be prevented as much as possible.

In this embodiment, the wafer stage 12 is described by way of an example. The above-description may be applied to the reticle stage 14. Moreover, for the optical elements (e.g., a mirror, a shutter, a stop and the like) constituting the optical system 16, especially for optical elements which can be driven, the circulation of the cooling water and the temperature control can be applied similarly to this embodiment.

Third Embodiment

Figure 4:
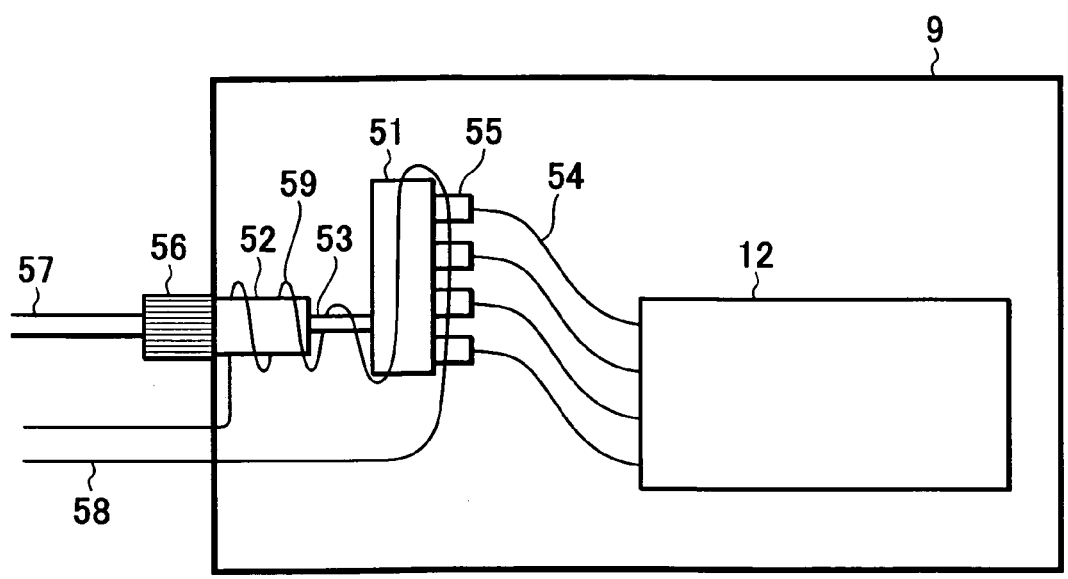
FIG. 4 illustrates a third embodiment of the present invention.

Hereinafter, a third embodiment of the present invention will be described with reference to FIG. 4. FIG. 4 shows only a driving system that is a part of the wafer stage 12 of the exposure apparatus in the vacuum state. The following elements of the driving system are depicted in FIG. 4: an electronic substrate 51 made of resin having a driver circuit formed therein to drive the wafer stage 12, a resin connector 52 connected to a feed-through of the chamber 9, a power source supply cable 53 made of resin, cables 54 for feeding a signal to the respective parts of the wafer stage 12, resin connectors 55 for the cables 54 on the circuit side, a feed-through 56 for feeding power or a signal from the outside of the chamber 9, a cable 57 for power and a signal to be supplied from an exposure apparatus controller (not shown), cooling water piping 58, and cooling-water metallic piping 59 arranged in contact with the connector 52 and the substrate 51 for cooling.

In the above-described embodiments, the surface of a resin tube, which is flexible, is kept at a low temperature by way of an example. On the other hand, in this embodiment, parts made of resin and set in the fixed state are cooled. The wafer stage 12 is driven with a linear motor. Thus, the power consumption is large. Accordingly, a large amount of power is applied to the driver circuit and the cables 53 and 54 provided before and after the driver circuit and connected thereto. Thus, a large current flows through the cables 53 and 54 and the connectors 55, which are significantly heated. Moreover, the driver circuit is heated as well. Preferably, the driver circuit or the like is provided outside the chamber 9. However, in some cases, such circuits must be positioned near the driving part. In such cases, the temperature of the connectors 55, the cables 53 and 54, and the substrate 51, which are made of resin, becomes higher than the ambient temperature. As a result, a relatively large amount of gas is emitted from the resin surfaces. This in turn may cause the optical elements to deteriorate as described above. According to the third embodiment, the metallic piping 59 is placed in contact with the resin parts. In addition, metallic blocks having high heat conductivity are placed in contact with the resin parts, so that the resin surfaces are cooled as much as possible. Even for structures which can be completely covered and cooled with much difficulty, such as the connectors 55, the cables 53 and 54, and the like, their resin surfaces, although the heat conduction is inferior, can be lowered to about 15° C., e.g., by circulation of cooling water having a temperature of about 5° C. As described above, the ratio of organic material of the residual gas components in the exposure apparatus can be reduced by lowering the resin surface temperature, even if the degree of reduction is small. Thus, the deterioration of the optical elements in the exposure apparatus can be suppressed, and the performance of the exposure apparatus can be maintained.

Materials which may be deposited on and adhere to the surfaces of the optical elements can be reduced by cooling the resin parts which are arranged near heat sources, such as the electronic substrate 51, the power supply cable 53, other relevant electric parts, and parts capable of absorbing light to generate heat, by use of the cooling mechanism of the above-described embodiment.

Moreover, according to the above-described embodiment, the resin parts (e.g., resin tubes, urethane tubes or the like) are cooled mainly by using cooling water. However, the invention is not limited to cooling water. The resin parts may be cooled with cooled air or any kind of gas, preferably, an inert gas as described in the first embodiment. Moreover, radiation may be used to control the temperature to cool the surfaces of the resin parts. Furthermore, a combination of cooling by radiation with the temperature-control using a Peltier device 45 (i.e., cooling and heating) may be used.

Also, according to this embodiment, the surface temperature of the resin tube is controlled based on the temperatures of the inner walls in the exposure apparatus, the wafer surface, and the like. Controlling the surface temperature of the resin tube is not limited to the above described methods. The temperature of any member of the exposure apparatus (e.g., an optical element such as a mirror, a supporting member for supporting the mirror or the like, the barrel, the reticle stage 14, the wafer stage 12, etc.) may be used to control the surface temperature of the resin tube.

In the first to third embodiments, the temperature of the liquid or gas flowing through the resin tube is appropriately adjusted. Preferably, the resin tube has a double structure, i.e., an inner resin tube and an outer resin tube. This would allow two kinds of fluids, liquids or gases to flow through the resin tube. A fluid having a temperature suitable for cooling objects to be cooled (e.g. the stages 12 and 14, the mirrors 20 and 21, and the like) would flow through the inside resin tube. A fluid having a temperature which is suitably adjusted to prevent a material (e.g., a carbon compound or the like) that tends to be deposited on and adhere to the surfaces of the optical elements from being scattered from the outside resin tube in the exposure apparatus flows through the space between the outside and inside resin tubes. In this case, the temperature of the fluid flowing through the space is set to be lower than that of the fluid flowing through the inside resin tube.

According to the above-described embodiment, an organic compound can be effectively suppressed from being released from the surfaces of the resin parts. Thus, the concentration of the organic compound in the exposure space can be greatly reduced.

Fourth Embodiment

Figure 5:
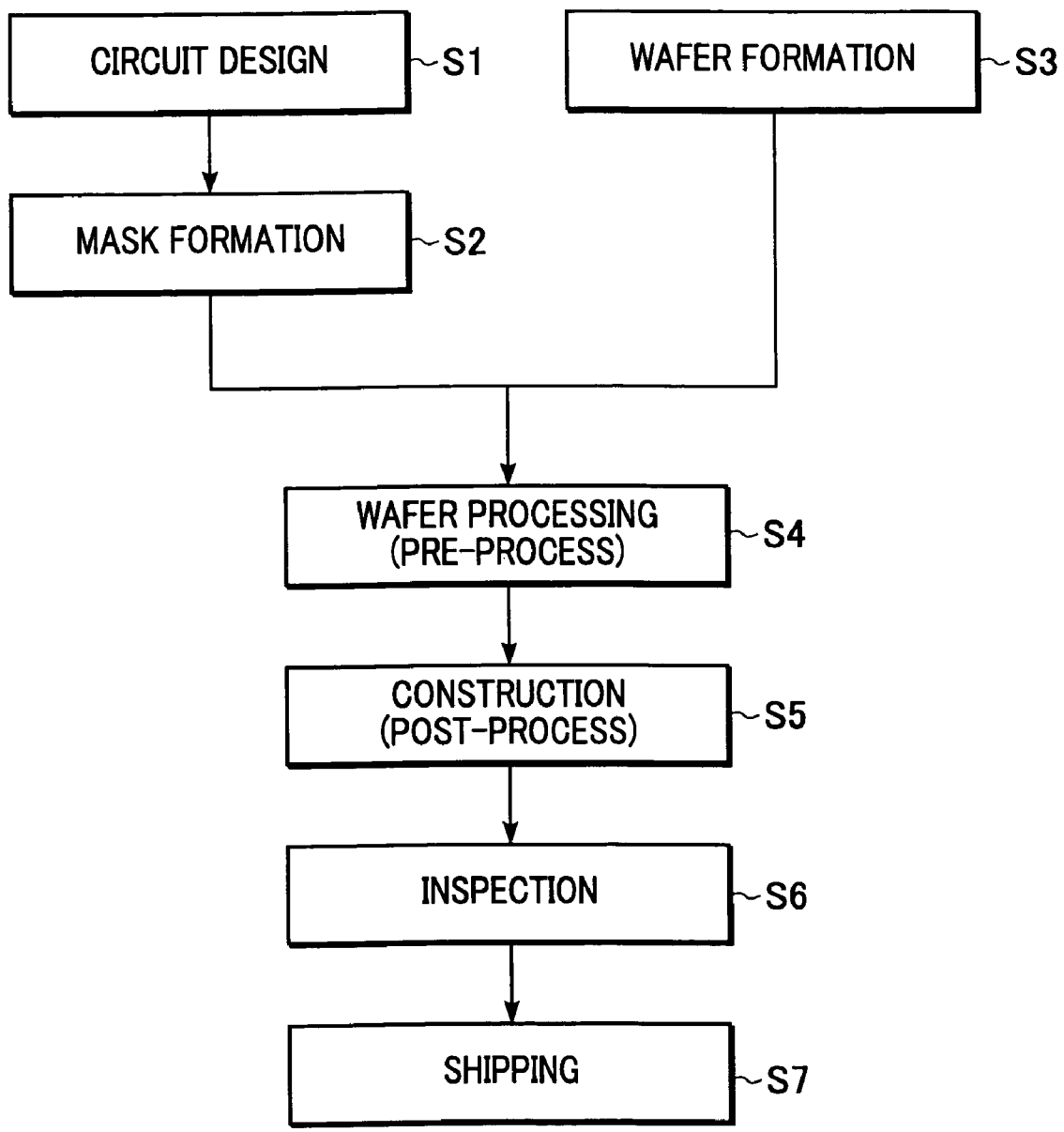
FIG. 5 is a flow chart showing a method of producing a device containing the exposure apparatus of the present invention.

Hereinafter, an embodiment of a method of producing a device using the above-described exposure apparatus will be described. FIG. 5 is a flow chart showing the production of a device (e.g., semiconductor chips such as IC or LSI, LCDs, CCDs, etc.). The production of a semiconductor chip will be described below by way of an example. At step S1 (circuit design), the circuit of the device is designed. At step S2 (mask formation), a mask having the pattern of the designed circuit is produced/formed. At step S3 (wafer formation), a wafer is produced/formed using a material such as silicon or the like. At step S4 (wafer processing), "pre-processing" occurs, in that a circuit to be practically used is formed on the wafer according to a lithographic technique using the mask and the wafer. In step S5 (construction), "post-processing" occurs, in that a semiconductor chip is formed using the wafer produced/formed in step S4. Step S5 includes an assembly process (i.e., dicing and bonding), a packaging process (i.e., chip sealing), and so forth. At step S6 (inspection), the operation, durability and the like of the semiconductor device formed in step S5 are tested. The semiconductor device is produced via the above steps, and in step S7, it is shipped.

Figure 6:
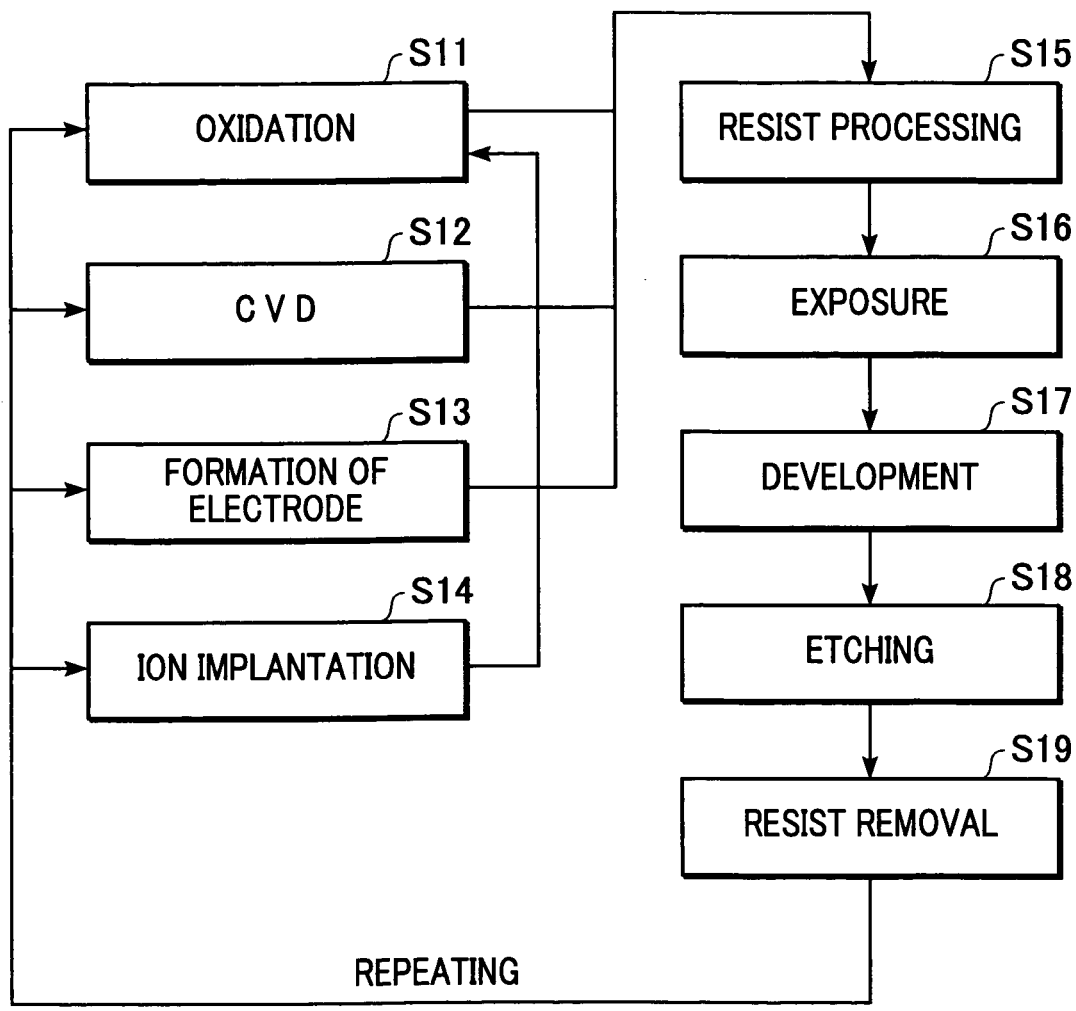
FIG. 6 is a flow chart showing a wafer-processing as step 4 shown in FIG. 5.

FIG. 6 is a flow chart showing the wafer process of step S4 in detail. At step S11 (oxidation), the surface of the wafer is oxidized. At step S12 (CVD), an insulation film is formed on the surface of the wafer. At step S13 (formation of electrode), an electrode is formed on the wafer by vapor deposition or the like. At step S14 (ion implantation), ions are implanted into the wafer. At step S15 (resist processing), a photosensitive material is coated on the wafer. At step S16 (exposure), the wafer is exposed via the mask having the circuit pattern formed thereon by means of one of the exposure apparatuses described above. At step S17 (development), the exposed wafer is developed. At step S18 (etching), the surface of the wafer, excluding the developed resist image, is removed. At step S19, (resist removal), the resist, which becomes unnecessary after the etching, is removed. These steps are repeated, and thereby, multiple circuit patterns are formed on the wafer. According to the method of producing a device of this embodiment, a higher grade device can be produced compared to such a device produced by known techniques. The present invention provides a method of producing a device using one of the exposure apparatuses described above and a device produced by the method of the present invention.

The entire disclosure of Japanese Patent Application No. 2003-057104 filed on Mar. 4, 2003 including claims, specification, drawings, and abstract is incorporated herein by reference in its entirety.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which exposes a substrate through a pattern of an original plate, comprising:
   a stage configured to move the substrate;
   a chuck provided on the stage and configured to hold the substrate;
   a piping made of resin and connected to the stage;
   means for feeding into the piping liquid or gas to cool the stage; and
   a heating mechanism configured to heat the chuck so that the temperature of the substrate is higher by at least 5° C. than the temperature of the liquid or gas,
   wherein the temperature of the liquid or gas is set to be between 5° C. and 18° C.

2. An exposure apparatus according to claim 1, further comprising a chamber enclosing the stage,
   wherein the predetermined temperature of the liquid or gas is lower than the temperature of an inner-wall of the chamber.

3. An exposure apparatus according to claim 2, wherein the inside of the chamber is kept in a vacuum state.

4. An exposure apparatus according to claim 1, wherein the piping contains a first pipe through which a first fluid flows, and a second pipe through which a second fluid flows.

5. An exposure apparatus according to claim 4, wherein the piping is formed in such a manner that the second pipe encloses the first pipe.

6. An exposure apparatus according to claim 5, wherein the temperature of the first fluid is lower than the temperature of the second fluid.

7. An exposure apparatus according to claim 5, wherein the temperature of the second fluid is lower than the temperature of the substrate.

8. An exposure apparatus according to claim 1, wherein the heating mechanism contains a Peltier device.

9. A method of producing a semiconductor device utilizing an exposure apparatus which is configured to expose a substrate through a pattern of an original plate, the exposure apparatus comprising a stage configured to move the substrate; a chuck provided on the stage and configured to hold the substrate; a piping made of resin and connected to the stage; a means for feeding into the piping liquid or gas to cool the stage; and a heating mechanism configured to heat the chuck so that the temperature of the substrate is higher by at least 5° C. than the temperature of the liquid or gas, wherein the temperature of the liquid or gas is set to be between 5° C. and 18° C., the method comprising:
   exposing the substrate utilizing the exposure apparatus; and
   developing the exposed substrate.

10. A method for reducing out-gassing from flexible resin tubes utilized inside a vacuum chamber which is part of an exposure apparatus for manufacturing semiconductor devices, the method performed for the purpose of reducing the formation of unwanted material deposits onto optical elements contained within the chamber; the exposure apparatus including a chamber unit enclosing at least one of a wafer stage unit, a reticle stage unit, and a projection optical system, thereby allowing at least one of a vacuum to be formed within the chamber or an inert gas to be filled within the chamber, the exposure apparatus further including a circulating apparatus configured to circulate a coolant via the flexible resin tubes through at least one of the wafer stage, reticle stage and projection optical system for controlling temperatures of the same; the method comprising:
   maintaining a temperature of the coolant at about 10° C. lower than the lowest of either a first temperature taken proximate the inner wall surface or a second temperature of the wafer,
   whereby out-gassing from the resin tubes is reduced by maintaining the temperature of the coolant at about 10° C. lower than the lowest of either the first and second temperatures.

11. The method according to claim 10, wherein the coolant comprises circulated water maintained between 5° C. and 18° C. by the circulating apparatus, thereby, preventing stiffening of the flexible resin tubes due to freezing and the formation of condensation.

12. The method according to claim 10, wherein the flexible resin tubes are composed of urethane resin.

13. The method according to claim 10, wherein the wafer stage unit includes a wafer stage platen and a wafer stage adapted to slidably move on a surface of the wafer stage platen, and the wafer stage further includes an upper surface adapted to receive a wafer.

14. The method according to claim 10, wherein the reticle stage unit includes a reticle stage support, a reticle stage adapted to slidably move on a surface of the reticle stage support, and a reticle positioned on a lower surface of the reticle stage.

15. The method according to claim 10, wherein the apparatus further includes gas-bearings utilized in the wafer stage unit to provide a slidable interface between the wafer stage platen and the wafer stage, and a gas supply configured to supply gas via flexible resin gas tubes to the wafer stage unit;
the method further comprising:
maintaining a temperature of the gas at about 10° C. lower than the lowest of either the first and second temperatures,
whereby out-gassing from the resin gas tubes is reduced by maintaining the temperature of the gas at about 10° C. lower than the lowest the first and second temperatures.

16. The method according to claim 10, the apparatus further including gas-bearings utilized in the reticle stage unit to provide a slidable interface between the reticle stage support and the reticle stage, and a gas supply configured to supply gas via flexible resin gas tubes to the reticle stage unit; the method further comprising:
maintaining a temperature of the gas at about 10° C. lower than the lowest of either the first and second temperatures,
whereby out-gassing from the resin gas tubes is reduced by maintaining the temperature of the gas at about 10° C. lower than the lowest of either the first and second temperatures.

17. The method according to claim 13, wherein the wafer stage unit further includes a peltier device positioned on top of the wafer stage, a seat positioned on top of the pettier device, a wafer chuck and a wafer positional reference system positioned on top of the seat, and a peltier device controller unit configured to control the peltier device; the method further comprising:
calculating a difference between temperatures of the wafer stage and the seat; and
applying a voltage to the peltier device to maintain a target temperature at the wafer,
whereby maintaining a target temperature at the wafer prevents a change in position between the wafer and the wafer positional reference system.

18. The method according to claim 13, wherein the wafer stage unit further includes a heater device positioned on top of the wafer stage, a seat positioned on top of the heater device, a wafer chuck and a wafer positional reference system positioned on top of the seat, and a heater device controller unit configured to control the heater device; the method further comprising:
calculating a difference between temperatures of the wafer stage and the seat; and
controlling the heater device to maintain a target temperature at the wafer,
whereby maintaining a target temperature at the wafer prevents a change in position between the wafer and the wafer positional reference system.

19. The method according to claim 13, wherein the wafer stage unit further includes a driving system including a driver circuit, a plurality of cables having resin connectors in communication with the driver circuit and the wafer stage for feeding signals to the wafer stage, a resin connecter connected to a feed-through of the chamber, a resin power supply cable routed through the feed-through and configured to supply power to the driver circuit; and metallic piping wrapped around the resin connectors, the resin power supply cable and the driver circuit, wherein coolant is circulated through the metallic piping; the method further comprising:
lowering and maintaining the temperature of the driver system at a target temperature;
whereby out-gassing from the resin connectors, the resin power supply cable and the driver circuit is reduced by lowering and maintaining the temperature of the driver system at the target temperature.

20. The method according to claim 19, wherein the target temperature is about 15° C.

21. The method according to claim 10, wherein the flexible resin tubes comprises a double structure having an inner tube and an outer tube concentrically formed around the inner tube; the method further including:
circulating a second coolant to at least one of the wafer stage, reticle stage and projection optical system for controlling temperatures of the same via the inner tube; and
circulating the coolant via the outer tube whereby out-gassing from the resin tubes is reduced by maintaining the temperature of the coolant at about 10° C. lower than the lowest of either the first and second temperatures.

22. The method according to claim 21, the method further comprising maintaining the temperature of the second coolant in the inner tube higher than the temperature of the coolant in the outer tube.

23. The method according to claim 21, wherein one of the coolant and second coolant is gas and the other is liquid.

24. An exposure apparatus for manufacturing semiconductor devices, the apparatus having an out-gassing reduction system for reducing out-gassing from flexible resin tubes utilized inside a vacuum chamber which is part of the exposure apparatus, the out-gassing system integrated therein the exposure apparatus for the purpose of reducing the formation of unwanted material deposits onto optical elements contained within the chamber; the exposure apparatus comprising:
a chamber unit enclosing at least one of a wafer stage unit, a reticle stage unit, and a projection optical system, thereby allowing at least one of a vacuum to be formed within the chamber and an inert gas to be filled within the chamber; and
a circulating apparatus configured to circulate a coolant via the flexible resin tubes through at least one of the wafer stage, reticle stage and projection optical system for controlling temperatures of the same,
wherein a temperature of the coolant is maintained at about 10° C. lower than the lowest of either a first temperature taken proximate the inner wall surface or a second temperature of the wafer, whereby out-gassing from the resin tubes is reduced by maintaining the temperature of the coolant at about 10° C. lower than the lowest of either the first and second temperatures.

25. The exposure apparatus according to claim 24, wherein the coolant comprises circulated water maintained between 5° C. and 18° C. by the circulating apparatus, thereby, preventing stiffening of the flexible resin tubes due to freezing and the formation of condensation.

26. The exposure apparatus according to claim 24, wherein the flexible resin tubes are composed of urethane resin.

27. The exposure apparatus according to claim 24, wherein the wafer stage unit includes a wafer stage platen and a wafer stage adapted to slidably move on a surface of the wafer stage platen, and the wafer stage further includes an upper surface adapted to receive a wafer.

28. The exposure apparatus according to claim 24, wherein the reticle stage unit includes a reticle stage support, a reticle stage adapted to slidably move on a surf ace of the reticle stage support, and a reticle positioned on a lower surface of the reticle stage.

29. The exposure apparatus according to claim 24, wherein the exposure apparatus further includes gas-bearings utilized in the wafer stage unit to provide a slidable interface between the wafer stage platen and the wafer stage, and a gas supply configured to supply gas via flexible resin gas tubes to the wafer stage unit;
wherein a temperature of the gas is maintained at about 10° C. lower than the lowest of either the first and second temperatures,
whereby out-gassing from the resin gas tubes is reduced by maintaining the temperature of the gas at about 10° C. lower than the lowest of either the first and second temperatures.

30. The exposure apparatus according to claim 24, wherein the exposure apparatus further includes gas-bearings utilized in the reticle stage unit to provide a slidable interface between the reticle stage support and the reticle stage, and a gas supply configured to supply gas via flexible resin gas tubes to the reticle stage unit;
wherein a temperature of the gas is maintained at about 10° C. lower than the lowest of either the first and second temperatures,
whereby out-gassing from the resin gas tubes is reduced by maintaining the temperature of the gas at about 10° C. lower than the lowest of either the first and second temperatures.

31. The exposure apparatus according to claim 27, wherein the wafer stage unit further includes a peltier device positioned on top of the wafer stage, a seat positioned on top of the peltier device, a wafer chuck and a wafer positional reference system positioned on top of the seat, and a peltier device controller unit configured to control the peltier device by applying a vohage to the peltier device to maintain a target temperature at the wafer;
wherein a temperature of the wafer stage and a temperature of the seat is obtained and a difference between the temperatures of the wafer stage and the seat is calculated,
whereby maintaining a target temperature at the wafer prevents a change in position between the wafer and the wafer positional reference system.

32. The exposure apparatus according to claim 27, wherein the wafer stage unit further includes a heater device positioned on top of the wafer stage, a seat positioned on top of the heater device, a wafer chuck and a wafer positional reference system positioned on top of the seat, and a heater device controller unit configured to control the heater device;
wherein a temperature of the wafer stage and a temperature of the seat is obtained and a difference between the temperatures of the wafer stage and the seat is calculated,
whereby maintaining a target temperature at the wafer prevents a change in position between the wafer and the wafer positional reference system.

33. The exposure apparatus according to claim 27, wherein the wafer stage unit further includes a driving system including a driver circuit, a plurality of cables having resin connectors in communication with the driver circuit and the wafer stage for feeding signals to the wafer stage, a resin connecter connected to a feed-through of the chamber, a resin power supply cable routed through the feed-through and configured to supply power to the driver circuit; and metallic piping wrapped around the resin connectors, the resin power supply cable and the driver circuit, wherein coolant is circulated through the metallic piping;
wherein the temperature of the driver system is lowered and maintained at a target temperature;
whereby out-gassing from the resin connectors, the resin power supply cable and the driver circuit is reduced by lowering and maintaining the temperature of the driver system at the target temperature.

34. The exposure apparatus according to claim 33, wherein the target temperature is about 15° C.

35. The exposure apparatus according to claim 24, the flexible resin tubes further comprising a double structure having an inner tube and an outer tube concentrically formed around the inner tube,
wherein a second coolant is circulated to at least one of the wafer stage, reticle stage and projection optical system for controlling temperatures of the same via the inner tube, and
wherein the coolant is circulated via the outer tube whereby out-gassing from the resin tubes is reduced by maintaining the temperature of the coolant at about 10° C. lower than the lowest of either the first and second temperatures.

36. The exposure apparatus according to claim 35, wherein the temperature of the second coolant in the inner tube is maintained higher than the temperature of the coolant in the outer tube.

37. The exposure apparatus according to claim 35, wherein one of the coolant and second coolant is gas and the other is liquid.

38. The exposure apparatus according to claim 24, further comprising
an inner wall temperature sensor configured to obtain a temperature at an inner wall surface of the chamber unit; and
a wafer temperature sensor configured obtain a temperature at a surf ace of the wafer.

* * * * *